(12) United States Patent
Moon et al.

(10) Patent No.: US 9,722,168 B2
(45) Date of Patent: Aug. 1, 2017

(54) VIBRATION GENERATING APPARATUS

(71) Applicant: SAMSUNG ELECTRO-MECHANICS CO., LTD., Suwon-Si (KR)

(72) Inventors: Dong Su Moon, Suwon-Si (KR); Kyung Su Park, Suwon-Si (KR); Sang Jin Lee, Suwon-Si (KR); Jae Kyung Kim, Suwon-Si (KR); Joon Choi, Suwon-Si (KR); Yeon Ho Son, Suwon-Si (KR)

(73) Assignee: MPLUS CO., LTD., Suwon-si, Gyeonggi-Do (KR)

( * ) Notice: Subject to any disclaimer, the term of this patent is extended or adjusted under 35 U.S.C. 154(b) by 471 days.

(21) Appl. No.: 14/590,970

(22) Filed: Jan. 6, 2015

(65) Prior Publication Data

US 2015/0214463 A1 Jul. 30, 2015

(30) Foreign Application Priority Data

Jan. 28, 2014 (KR) ........................ 10-2014-0010057

(51) Int. Cl.

| H01L 41/04 | (2006.01) |
|---|---|
| H01L 41/053 | (2006.01) |
| H01L 41/09 | (2006.01) |
| B06B 1/06 | (2006.01) |
| B06B 1/14 | (2006.01) |

(52) U.S. Cl.
CPC ........ *H01L 41/0533* (2013.01); *B06B 1/0603* (2013.01); *B06B 1/14* (2013.01); *H01L 41/053* (2013.01); *H01L 41/09* (2013.01); *H01L 41/0933* (2013.01)

(58) Field of Classification Search
CPC ............... H01L 41/053; H01L 41/0533; H01L 41/0933; B06B 1/0603; B06B 1/14
See application file for complete search history.

(56) References Cited

U.S. PATENT DOCUMENTS

| 9,660,172 B2* | 5/2017 | Moon ................. H01L 41/0475 |
|---|---|---|
| 2012/0212100 A1* | 8/2012 | Lee ....................... H01L 41/053 |
| | | 310/317 |
| 2014/0055006 A1* | 2/2014 | Oh ......................... H02N 2/001 |
| | | 310/329 |
| 2014/0070667 A1* | 3/2014 | Oh ........................ B06B 1/0644 |
| | | 310/326 |
| 2014/0145560 A1* | 5/2014 | Park ................... H01L 41/0933 |
| | | 310/323.01 |
| 2014/0152148 A1* | 6/2014 | Oh ......................... G06F 3/016 |
| | | 310/321 |

(Continued)

FOREIGN PATENT DOCUMENTS

| KR | 10-2011-0045486 | 5/2011 |
|---|---|---|
| KR | 10-1157868 B1 | 6/2012 |

*Primary Examiner* — J. San Martin
(74) *Attorney, Agent, or Firm* — LRK Patent Law Firm (57) ABSTRACT

There is provided a vibration generating apparatus including: an elastic member having both end portions fixed to a housing; a piezoelectric element installed on one surface of the elastic member; and a circuit board connected to the piezoelectric element, wherein the elastic member has support parts formed on both side surfaces of both end portions thereof and bent downwardly in order to be installed in the housing, and a portion of the circuit board passing between the support parts has a flat panel shape.

10 Claims, 8 Drawing Sheets

(56) References Cited

U.S. PATENT DOCUMENTS

| | | | |
|---|---|---|---|
| 2014/0285064 A1* | 9/2014 | Kim | B06B 1/0644 |
| | | | 310/317 |
| 2014/0346924 A1* | 11/2014 | Son | B06B 1/0603 |
| | | | 310/317 |
| 2014/0346926 A1* | 11/2014 | Choi | H02N 2/006 |
| | | | 310/323.01 |
| 2015/0008793 A1* | 1/2015 | Park | B06B 1/0648 |
| | | | 310/323.01 |
| 2015/0188027 A1* | 7/2015 | Moon | H01L 41/053 |
| | | | 310/329 |
| 2015/0194593 A1* | 7/2015 | Park | H01L 41/0933 |
| | | | 310/329 |
| 2015/0214463 A1* | 7/2015 | Moon | H01L 41/0533 |
| | | | 310/345 |
| 2015/0214464 A1* | 7/2015 | Park | B06B 1/10 |
| | | | 310/328 |
| 2015/0214467 A1* | 7/2015 | Han | B06B 1/10 |
| | | | 310/323.01 |
| 2015/0236240 A1* | 8/2015 | Park | H01L 41/053 |
| | | | 310/323.01 |
| 2015/0236241 A1* | 8/2015 | Moon | B06B 1/12 |
| | | | 310/323.01 |
| 2015/0318463 A1* | 11/2015 | Son | H01L 41/0933 |
| | | | 310/321 |
| 2015/0333699 A1* | 11/2015 | Kim | G06F 3/041 |
| | | | 345/173 |
| 2016/0030978 A1* | 2/2016 | Moon | B06B 1/0603 |
| | | | 310/323.01 |
| 2016/0105131 A1* | 4/2016 | Oh | H02N 2/001 |
| | | | 310/329 |

* cited by examiner

# VIBRATION GENERATING APPARATUS

CROSS-REFERENCE TO RELATED APPLICATION

This application claims the priority and benefit of Korean Patent Application No. 10-2014-0010057 filed on Jan. 28, 2014, with the Korean Intellectual Property Office, the disclosure of which is incorporated in its entirety herein by reference.

BACKGROUND

The present disclosure relates to a vibration generating apparatus.

A vibration generating apparatus, converting electrical energy into mechanical vibrations using the principle of the generation of electromagnetic force, has been mounted in a mobile phone, or the like, to thereby be used for silently notifying a user of call reception by transferring vibrations thereto.

In addition, in accordance with the rapid expansion in market demand for mobile devices such as mobile phones, and the like, increased functionality has been provided in mobile devices. In addition, miniaturization and improvements in the quality of the mobile devices have been gradually required.

In accordance with this trend, demand for the development of vibration generating apparatuses having a new structure capable of overcoming disadvantages of existing vibration generating apparatuses and having significantly improved quality has increased.

Further, recently, mobile phones have been replaced by smartphones, and a touchscreen scheme has been adopted for use in such smart phones. Therefore, the use of vibration generating apparatuses has increased for the purpose of generating vibrations at the time of a touch interaction.

In addition, recently, a vibration generating apparatus using a piezoelectric element has been commercialized. The vibration generating apparatus, using a principle of an inverse piezoelectric effect of generating displacement by applying a voltage to the piezoelectric element, allows a mass body of a mover to move by the generated displacement to generate vibration force.

In the vibration generating apparatus having the above-mentioned structure, a bandwidth of a frequency at which vibration force of a predetermined level or more may be obtained is wide, such that stable vibration characteristics may be implemented.

Meanwhile, a circuit board may be installed in the vibration generating apparatus in order to apply the voltage to the piezoelectric element.

However, in accordance with the trend toward the miniaturization and the quality improvement of the mobile device, the vibration generating apparatus has been miniaturized, and since the circuit board is connected to the piezoelectric element that is deformed, a flexible printed circuit board has been generally used as the circuit board.

However, there may be a problem in that the circuit board that has been gradually miniaturized and thinned in order to prevent interference with other components may be easily damaged. In this case, the vibration generating apparatus is not operated, such that durability of the vibration generating apparatus is deteriorated.

As a result, the development of a structure capable of preventing the damage to the circuit board has been urgently demanded.

RELATED ART DOCUMENT (Patent Document 1) Korean Patent Laid-Open Publication No. 2011-45486

SUMMARY

An aspect of the present disclosure may provide a vibration generating apparatus capable of decreasing damage to a circuit board.

According to an aspect of the present disclosure, a vibration generating apparatus may include: an elastic member having both end portions fixed to a housing; a piezoelectric element installed on one surface of the elastic member; and a circuit board connected to the piezoelectric element, wherein the elastic member has support parts formed on both side surfaces of both end portions thereof and bent downwardly in order to be installed in the housing, and a portion of the circuit board passing between the support parts has a flat panel shape.

The circuit board may be a flexible printed circuit board, and one side of the circuit board may pass between the support parts and be then withdrawn to the outside of the housing.

The housing may include a case having an internal space and having a box shape in which a lower end portion thereof is open and a bracket assembled to the lower end portion of the case.

The bracket may have bonded parts formed at both end portions thereof and bent, the bonded parts being bonded to the support parts of the elastic member.

The support parts may be bonded to inner surfaces of the bonded parts.

The support parts may be bonded to outer surfaces of the bonded parts.

The case may have a withdrawal groove formed in one end surface thereof in order to withdraw the circuit board, and the bracket may be provided with an installation part on which one side of the circuit board withdrawn from the housing is seated.

The vibration generating apparatus may further include a mass body part disposed above the elastic member to increase a vibration amount.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Hereinafter, embodiments of the present disclosure will be described in detail with reference to the accompanying drawings.

The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Figure 1:
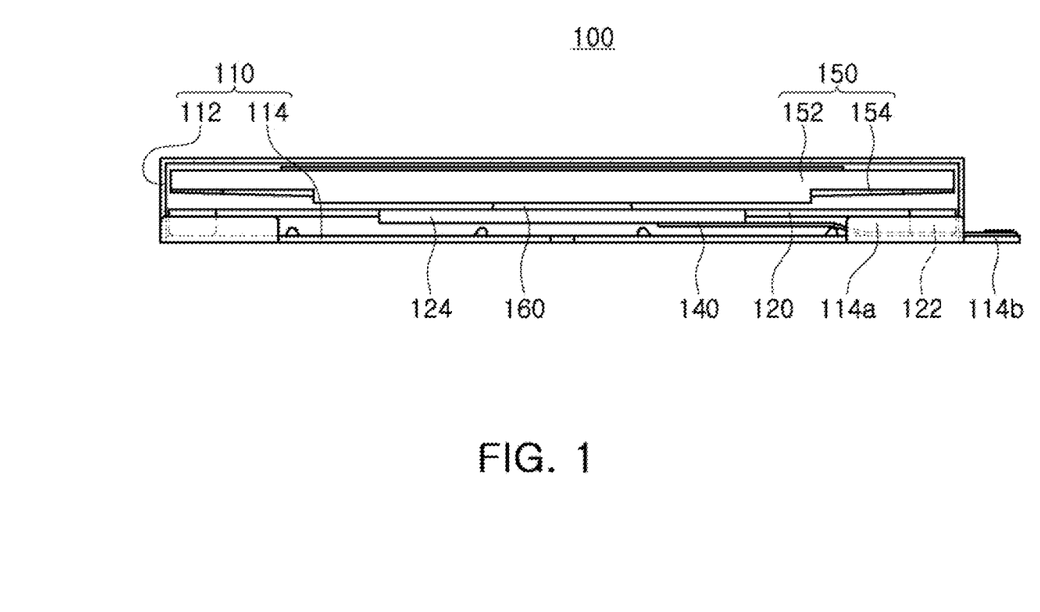
FIG. 1 is a schematic cross-sectional view showing a vibration generating apparatus according to an exemplary embodiment of the present disclosure.
Figure 2:
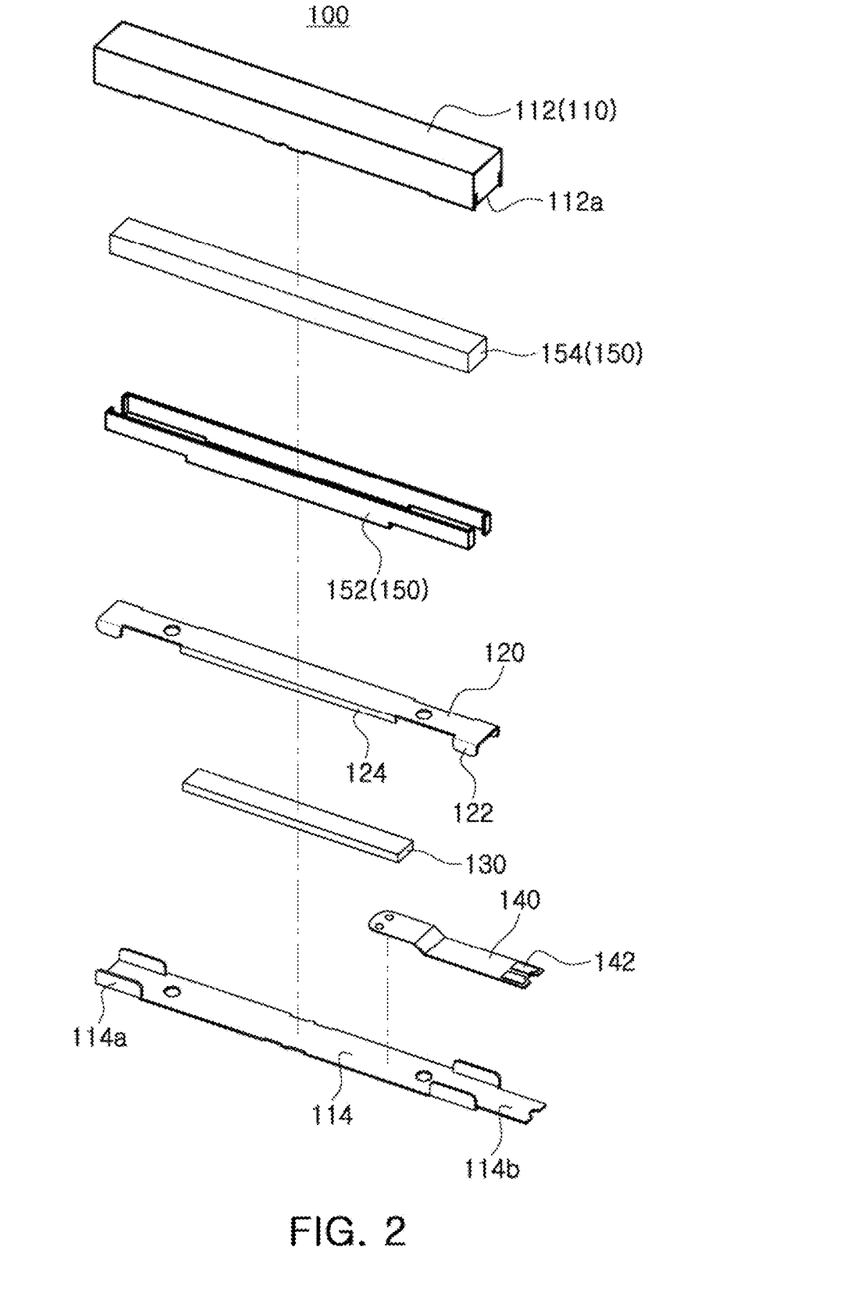
FIG. 2 is an exploded perspective view showing the vibration generating apparatus according to an exemplary embodiment of the present disclosure.
Figure 3:
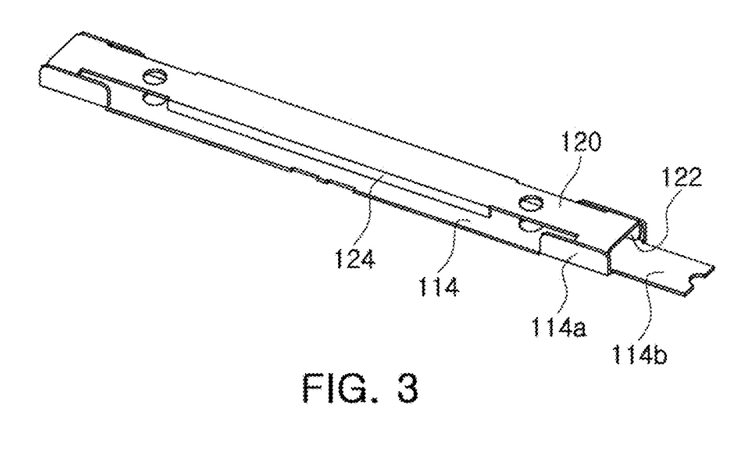
FIG. 3 is a perspective view showing an elastic member and a bracket of the vibration generating apparatus according to an exemplary embodiment of the present disclosure.
Figure 4:
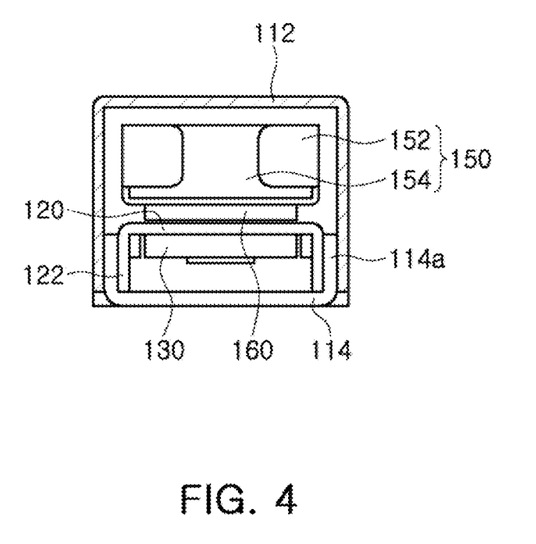
FIG. 4 is a side view showing the elastic member and the bracket of the vibration generating apparatus according to an exemplary embodiment of the present disclosure.

FIG. 1 is a schematic cross-sectional view showing a vibration generating apparatus according to an exemplary embodiment of the present disclosure; FIG. 2 is an exploded perspective view showing the vibration generating apparatus according to an exemplary embodiment of the present disclosure; FIG. 3 is a perspective view showing an elastic member and a bracket of the vibration generating apparatus according to an exemplary embodiment of the present disclosure; and FIG. 4 is a side view showing the elastic member and the bracket of the vibration generating apparatus according to an exemplary embodiment of the present disclosure.

Referring to FIGS. 1 through 4, a vibration generating apparatus 100 according to an exemplary embodiment of the present disclosure may include a housing 110, an elastic member 120, a piezoelectric element 130, a circuit board 140, and a mass body part 150 by way of example.

The housing 110 may form an appearance of the vibration generating apparatus 100 and have an internal space so that the elastic member 120, the piezoelectric element 130, the circuit board 140, the mass body part 150, and the like, may be accommodated therein.

To this end, the housing 110 may include a case 112 having an internal space and having a box shape in which a lower end portion thereof is open, and a bracket 114 assembled to the lower end portion of the case 112.

Meanwhile, the case 112 may have a rectangular parallelepiped shape, and the bracket 114 may have a plate shape. That is, the bracket 114 may be assembled to the lower end portion of the case 112 to form the housing 110.

Although the case in which the housing 110 has the rectangular parallelepiped shape has been described by way of example in the present exemplary embodiment, a shape of the housing is not limited thereto, but may be variously changed.

In addition, the case 112 may have a withdrawal groove 112a formed in one end surface thereof in order to withdraw the circuit board 140.

In addition, the bracket 114 may be provided with an installation part 114b on which one side of the circuit board 140 withdrawn from the housing 110 to the outside is seated, wherein the installation part 114b may be disposed at an outer portion of the case 112.

Meanwhile, the bracket 114 may have bonded parts 114a formed at both end portions thereof and bent in order to install the elastic member 120 thereon. The bonded parts 114a may be formed on both side surfaces of the bracket 114, respectively, and may contact inner surfaces of the case 112 at the time of assembling the case 112 and the bracket 114 to each other.

In addition, the bonded part 114a may have a length longer than that of a support part 122 of an elastic member 120 to be described below.

A detailed description thereof will be provided below.

The elastic member 120 may have both end portions fixed to the housing 110. Meanwhile, the elastic member 120 may have a plate shape, and may have both end portions that are fixed, such that it vertically vibrates at the time of deformation of the piezoelectric element 130.

In addition, the elastic member 120 may have support parts 122 formed on both side surfaces of both end portions thereof and bent downwardly in order to be installed in the housing 110. Meanwhile, the support parts 122 may be bonded to the bonded parts 114a of the bracket 114 described above by at least one of a welding method and an adhering method.

In addition, outer surfaces of the support parts 122 may be bonded to inner surfaces of the bonded parts 114a.

As described above, the elastic member 120 may be installed in the housing 110 by the support parts 122, such that the elastic member 120 may be maintained in a state in which lower portions of both end portions thereof are open.

That is, in the case in which the elastic member 120 is installed so that a lower surface thereof is supported by the bracket 114, a hole needs to be formed in the circuit board 140 in order to prevent interference with the bracket 114. Therefore, thin portions need to be formed at both sides of the hole formed in the circuit board. In this case, the thin portions disposed at both sides of the hole may be broken by heat due to welding at the time of welding the case 112 and the bracket 114 to each other.

However, since the support parts 122 are formed in the elastic member 120, the elastic member 120 may be maintained in the state in which the lower portions of both end portions thereof are open, such that a portion of the circuit board 140 disposed below one end portion of the elastic member 120 may be formed in a flat panel shape.

In other words, since the elastic member 120 may be fixed to the housing 110 through the support parts 122, the hole may not be formed in the circuit board 140. As a result, breakage of the circuit board 140 generated at the time of welding the case 112 and the bracket 114 to each other, that is, damage to the circuit board 140 may be prevented.

Meanwhile, the elastic member 120 may be provided with installation protrusions 124 for installing the piezoelectric element 130. The installation protrusions 124 may support side surfaces of the piezoelectric element 130 to prevent separation of the piezoelectric element 130 simultaneously with serving to increase a vibration amount of the elastic member 120 at the time of deformation of the piezoelectric element 130.

The piezoelectric element 130 may be installed on one surface of the elastic member 120. As an example, the piezoelectric element 130 may be installed on a lower surface of the elastic member 120. That is, the piezoelectric element 130 may be installed on the lower surface of the elastic member 120 so that both side surfaces thereof are supported by the installation protrusions 124 of the elastic member 120.

Meanwhile, the piezoelectric element 130 may be deformed in the case in which power is applied thereto, thereby serving to vibrate the elastic member 120. To this end, the piezoelectric element 130 may include at least one pair of external electrodes (not shown), which may include a positive (+) electrode and a negative (−) electrode.

The circuit board 140 may be connected to the piezoelectric element 130. That is, the circuit board 140 may have one side connected to the piezoelectric element 130 and the other side withdrawn to the outside of the housing 110 through the withdrawal groove 112a formed in the case 112.

In addition, the circuit board 140 may pass through a space between the support parts 122 provided at one end portion of the elastic member 120, and a portion of the circuit board 140 passing between the support parts 122 of the elastic member 120 may have a flat panel shape. In other words, a hole for preventing interference with the bracket 114 may not be formed in at least the portion of the circuit board 140 passing between the support parts 122 of the elastic member 120.

Therefore, the damage to the circuit board 140 generated at the time of welding the case 112 and the bracket 114 to each other may be prevented.

Meanwhile, the other side of the circuit board 140 may be seated on the installation part 114b provided in the bracket 114. In addition, the other side of the circuit board 140 seated on the installation part 114b may be provided with a connection terminal 142 for electrical connection with an external power supply.

In addition, the circuit board 150 may be a flexible printed circuit board (FPCB).

The mass body part 150 may be disposed above the elastic member 120 to serve to increase a vibration amount. Meanwhile, the mass body part 150 may be installed on an upper surface of the elastic member 120 through an adhering member 160.

In addition, the mass body part 150 may include a mass body case 152 having a box shape in which an upper portion thereof is open and a mass body 154 installed in the mass body case 152.

Further, the mass body case 152 and the elastic member 120 may have the adhering member 160 installed therebetween.

Meanwhile, a damper member (not shown) may be installed on at least one of the mass body 154 and the inner surface of the case 112 in order to prevent generation of noise and damage to the case 112 due to a contact between the mass body 154 and the case 112.

As described above, the elastic member 120 may be installed on the bracket 114 through the support parts 122, such that the portion of the circuit board 140 passing between the support parts 122 may be formed in the flat panel shape.

Therefore, the damage to the circuit board 140 generated at the time of assembling the case 112 and the bracket 114 to each other may be prevented.

Hereinafter, a modified example of an elastic member will be described with reference to the accompanying drawings. However, the same components as the above-mentioned components will be denoted by the same reference numerals, and a detailed description therefor will be replaced by the above-mentioned description and be omitted.

Figure 5:
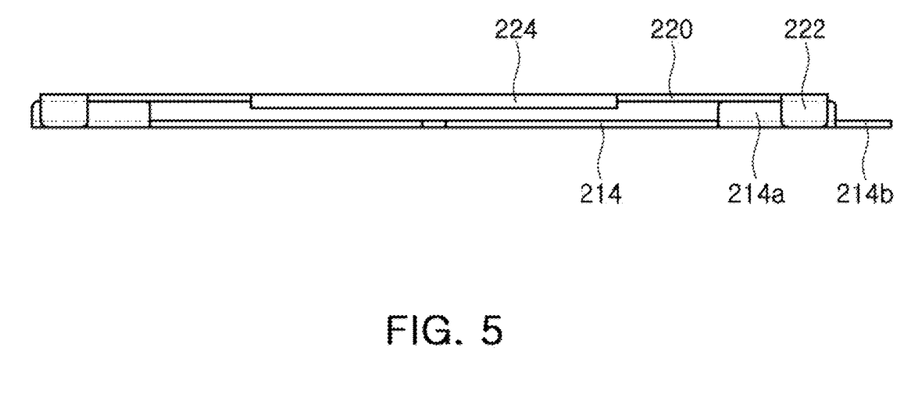
FIG. 5 is a front view showing a bracket and an elastic member included in a vibration generating apparatus according to another exemplary embodiment of the present disclosure.
Figure 6:
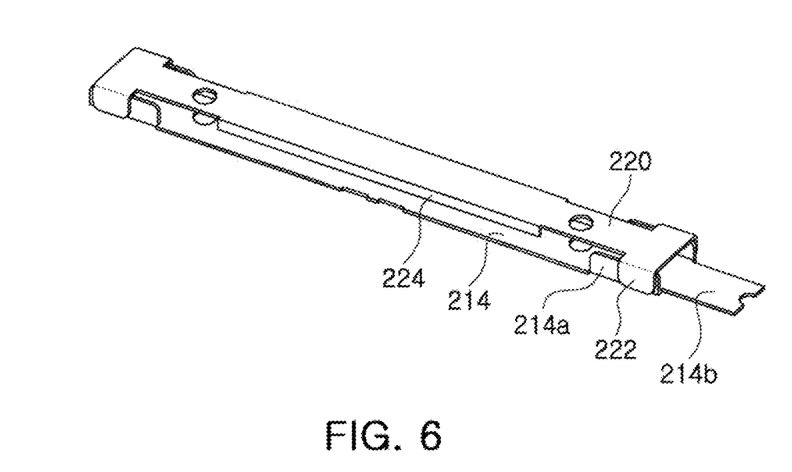
FIG. 6 is a perspective view showing the bracket and the elastic member included in the vibration generating apparatus according to another exemplary embodiment of the present disclosure.

FIG. 5 is a front view showing a bracket and an elastic member included in a vibration generating apparatus according to another exemplary embodiment of the present disclosure; and FIG. 6 is a perspective view showing the bracket and the elastic member included in the vibration generating apparatus according to another exemplary embodiment of the present disclosure.

Referring to FIGS. 5 and 6, an elastic member 220 may have both end portions fixed to the housing 110 (See FIG. 2). Meanwhile, the elastic member 220 may have a plate shape, and may have both end portions that are fixed, such that it vertically vibrates at the time of deformation of the piezoelectric element 130 (See FIG. 2).

In addition, the elastic member 220 may have support parts 222 formed on both side surfaces of both end portions thereof and bent downwardly in order to be installed in the housing 110. Meanwhile, the support parts 222 may be bonded to bonded parts 214a of a bracket 214 by at least one of a welding method and an adhering method.

In addition, inner surfaces of the support parts 222 may be bonded to outer surfaces of the bonded parts 214a.

As described above, the elastic member 220 may be installed on the bracket 214 by the support parts 222, such that the elastic member 220 may be maintained in a state in which lower portions of both end portions thereof are open.

That is, in the case in which the elastic member 220 is installed so that a lower surface thereof is supported by the bracket 214, a hole needs to be formed in the circuit board 140 (See FIG. 2) in order to prevent interference with the bracket 214. Therefore, thin portions need to be formed at both sides of the hole formed in the circuit board. In this case, the thin portions disposed at both sides of the hole may be broken by heat due to welding at the time of welding the case 112 and the bracket 214 to each other.

However, since the support parts 222 are formed in the elastic member 220, the elastic member 220 may be maintained in the state in which the lower portions of both end portions thereof are open, such that a portion of the circuit board 140 disposed below one end portion of the elastic member 220 may be formed in a flat panel shape.

In other words, since the elastic member 220 may be fixed to the housing 110 through the support parts 222, the hole may not be formed in the circuit board. As a result, breakage of the circuit board 140 generated at the time of welding the case 112 and the bracket 214 to each other, that is, damage to the circuit board 140 may be prevented.

Hereinafter, another modified example of an elastic member will be described with reference to the accompanying drawings.

Figure 7:
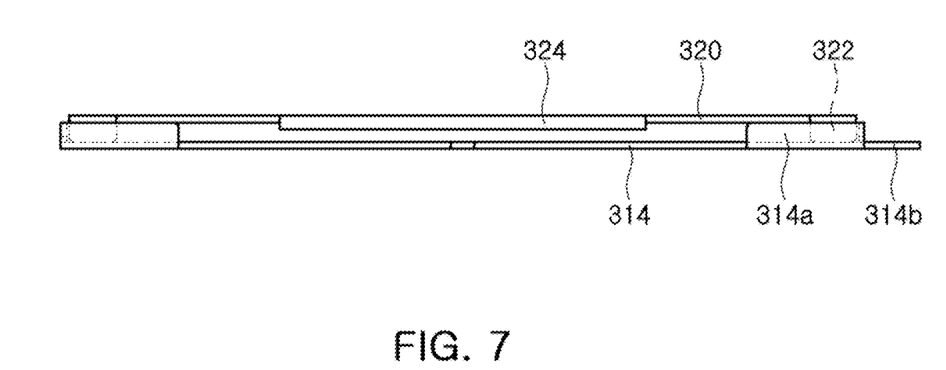
FIG. 7 is a front view showing an elastic member and a bracket included in a vibration generating apparatus according to another exemplary embodiment of the present disclosure.
Figure 8:
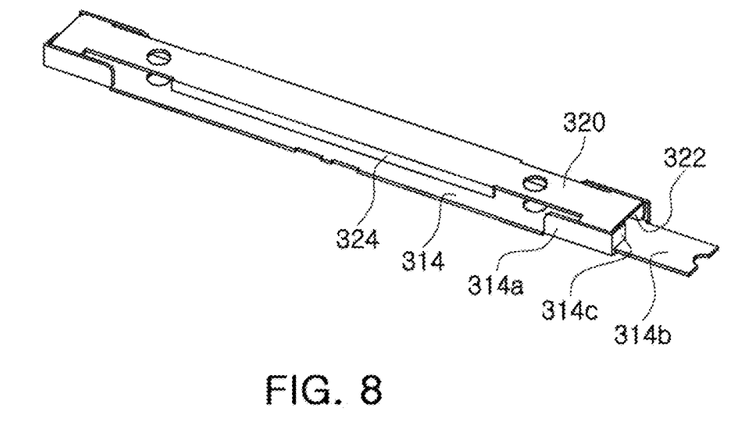
FIG. 8 is a perspective view showing the elastic member and the bracket included in a vibration generating apparatus according to another exemplary embodiment of the present disclosure.

FIG. 7 is a front view showing an elastic member and a bracket included in a vibration generating apparatus according to another exemplary embodiment of the present disclosure; and FIG. 8 is a perspective view showing the elastic member and the bracket included in a vibration generating apparatus according to another exemplary embodiment of the present disclosure.

Referring to FIGS. 7 and 8, a bracket 314 may be assembled to the case 112 (See FIG. 2) to form the housing 110.

Meanwhile, the bracket 314 may have a plate shape, and may have bonded parts 314a formed at both end portions thereof and bent in order to install an elastic member 320 thereon. The bonded parts 314a may be formed on both side surfaces of the bracket 314, respectively, and may contact inner surfaces of the case 112 at the time of assembling the case 112 and the bracket 314 to each other.

In addition, the bonded parts 314a may have stoppers 314c formed at distal ends thereof and bent inwardly in order to support end portions of the elastic member 320. Meanwhile, the stoppers 314c may be disposed so as to be spaced apart from an upper surface of the bracket 314 by a predetermined interval to secure a space allowing the circuit board 140 (See FIG. 2) to pass through a portion thereof.

In addition, the stoppers 314c may support end portions of the elastic member 320, such that the elastic member 320 may be fixedly installed at a predetermined position.

Meanwhile, the elastic member 320 may have both end portions fixed to the bracket 314. Meanwhile, the elastic member 320 may have a plate shape, and may have both end portions that are fixed, such that it vertically vibrates at the time of deformation of the piezoelectric element 130 (See FIG. 2).

In addition, the elastic member 320 may have support parts 322 formed on both side surfaces of both end portions thereof and bent downwardly in order to be installed on the bracket 314. Meanwhile, the support parts 322 may be bonded to the bonded parts 314a of the bracket 314 described above by at least one of a welding method and an adhering method.

In addition, outer surfaces of the support parts 322 may be bonded to inner surfaces of the bonded parts 314a.

As described above, the elastic member 320 may be installed on the bracket 314 by the support parts 322, such that the elastic member 320 may be maintained in a state in which lower portions of both end portions thereof are open.

As set forth above, according to exemplary embodiments of the present disclosure, the circuit board may pass between the support parts of the elastic member through the support parts of the elastic member, such that the damage to the circuit board may be decreased.

That is, a portion of the circuit board passing between the support parts of the elastic member may have the plate shape in which the hole is not formed therein, such that the breakage of the circuit board in this portion may be prevented.

While exemplary embodiments have been shown and described above, it will be apparent to those skilled in the art that modifications and variations could be made without departing from the scope of the present invention as defined by the appended claims.

What is claimed is:

1. A vibration generating apparatus comprising:
    an elastic member having both end portions fixed to a housing;
    a piezoelectric element installed on one surface of the elastic member; and
    a circuit board connected to the piezoelectric element,
    wherein the elastic member has support parts formed on both side surfaces of both end portions thereof and bent downwardly in order to be installed in the housing, and
    a portion of the circuit board passing between the support parts has a flat panel shape.

2. The vibration generating apparatus of claim 1, wherein the circuit board is a flexible printed circuit board, and
    one side of the circuit board passes between the support parts and is then withdrawn to the outside of the housing.

3. The vibration generating apparatus of claim 1, wherein the housing includes a case having an internal space and having a box shape in which a lower end portion thereof is open and a bracket assembled to the lower end portion of the case.

4. The vibration generating apparatus of claim 3, wherein the bracket has bonded parts formed at both end portions thereof and bent, the bonded parts being bonded to the support parts of the elastic member.

5. The vibration generating apparatus of claim 4, wherein the support parts are bonded to inner surfaces of the bonded parts.

6. The vibration generating apparatus of claim 4, wherein the support parts are bonded to outer surfaces of the bonded parts.

7. The vibration generating apparatus of claim 4, wherein the case has a withdrawal groove formed in one end surface thereof in order to withdraw the circuit board, and
    the bracket is provided with an installation part on which one side of the circuit board withdrawn from the housing is seated.

8. The vibration generating apparatus of claim 4, wherein the bonded parts have stoppers formed at distal ends thereof and bent inwardly in order to support a lower surface of the elastic member.

9. The vibration generating apparatus of claim 1, further comprising a mass body part disposed above the elastic member to increase a vibration amount.

10. A vibration generating apparatus comprising:
    a housing having an internal space;
    an elastic member having both end portions fixed to the housing;
    a piezoelectric element installed on one surface of the elastic member;
    a circuit board connected to the piezoelectric element; and
    a mass body part disposed above the piezoelectric element to increase vibrations,
    wherein the elastic member has support parts formed on both side surfaces of both end portions thereof and bent downwardly in order to be installed in the housing, and
    a portion of the circuit board passing between the support parts has a flat panel shape.

* * * * *